United States Patent [19]

Aono

[11] Patent Number: 5,769,300

[45] Date of Patent: Jun. 23, 1998

[54] AUTOMATIC PART FEEDING APPARATUS

[75] Inventor: Takami Aono, Hamamatsu, Japan

[73] Assignee: Tenryu Technics Co., Ltd., Hamamatsu, Japan

[21] Appl. No.: 752,184

[22] Filed: Nov. 18, 1996

[51] Int. Cl.[6] .............................. G03B 1/22; B65H 23/06
[52] U.S. Cl. ........................................ 226/69; 226/149
[58] Field of Search ................................ 226/62, 63, 69, 226/33, 39, 128, 134, 149, 158, 166

[56] References Cited

U.S. PATENT DOCUMENTS

| | | | |
|---|---|---|---|
| 1,267,412 | 5/1918 | Howell | 226/69 |
| 2,768,826 | 10/1956 | Gaite | 226/62 |
| 3,476,300 | 11/1969 | Ricciardi et al. | 226/69 X |
| 3,618,837 | 11/1971 | Jacobsen | 226/63 X |
| 4,534,630 | 8/1985 | Williamson | 226/62 X |
| 4,943,342 | 7/1990 | Golemon | 226/62 X |
| 5,310,301 | 5/1994 | Aono | 226/62 X |

FOREIGN PATENT DOCUMENTS

| | | |
|---|---|---|
| 59-7611 | 2/1984 | Japan . |
| 59-228798 | 12/1984 | Japan . |
| 63-178592 | 7/1988 | Japan . |
| 5-196112 | 8/1993 | Japan . |

*Primary Examiner*—Michael Mansen
*Attorney, Agent, or Firm*—Kanesaka & Takeuchi

[57] ABSTRACT

An automatic parts feeding apparatus of the invention is used to transfer a carrier tape for carrying parts thereon. The carrier tape has feed perforations formed in a predetermined pitch. The feeding apparatus is formed of a driving shaft rotated in one direction, a cam member fixed to the driving shaft and having a cam surface, a moving member abutting against the cam surface of the cam member, and a feed member attached to the moving member. The moving member is elevated, advanced, lowered and retreated through rotation of the cam member. The feed member engages at least one feed perforation of the carrier tape when the moving member is elevated by the first cam member, and it advances the carrier tape when the moving member is advanced. The feed member disengages from the feed perforation when the moving member is lowered. The carrier tape is moved by repeating the movements of the feed member.

4 Claims, 5 Drawing Sheets

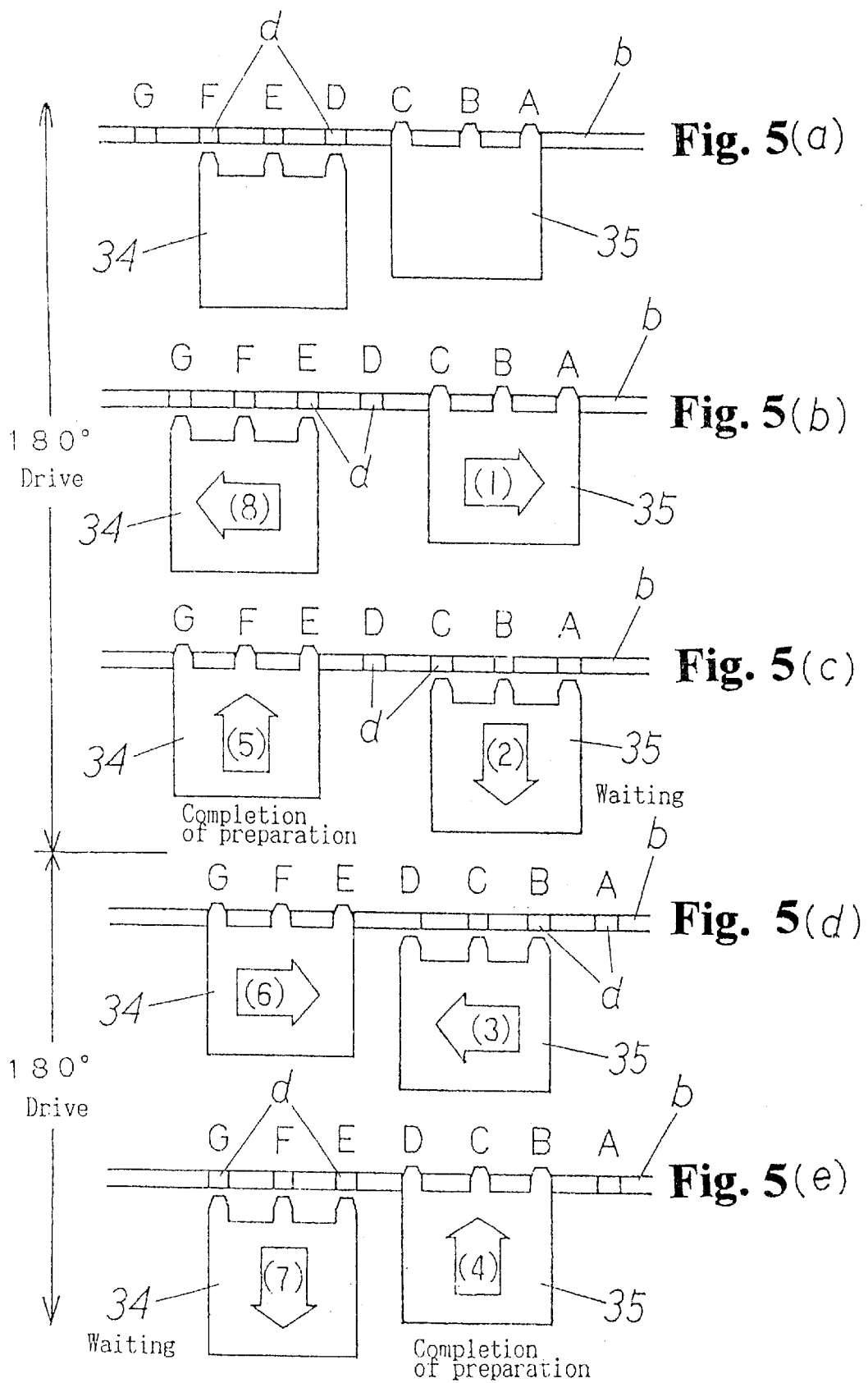

AUTOMATIC PART FEEDING APPARATUS

BACKGROUND OF THE INVENTION AND RELATED ART STATEMENT

The present invention relates to an automatic parts feeding apparatus capable of carrying parts accommodated on a carrier tape with a stable and positive pitch.

Heretofore, in an industrial field for assembling electronic parts or the like, automatic apparatuses for feeding electronic parts accommodated on carrier tapes with a predetermined pitch to attaching machines are disclosed in, for example, Japanese Patent Publication (KOKOKU) No. 59-7611, Japanese Patent Publication (KOKAI) No. 5-196112, Japanese Patent Publication (KOKAI) No. 59-228798, and Japanese Patent Publication (KOKAI) No. 63-178592.

In the apparatus, an air cylinder is used as a driving source for feeding a carrier tape, and a ratchet mechanism is used as a pitch feed mechanism.

In the apparatus using the air cylinder as the driving source, an operation is carried out intermittently at a high speed and the movement of the carrier tape causes impact to the electronic parts accommodated on the carrier tape. Since the parts are moved up and down by the impact, the electronic parts are not properly received at the attaching machine.

In the air cylinder type apparatus, response for the air driving force is delayed and response in the feed mechanism is reduced, so that the electronic parts may not be supplied properly to the attaching machine due to a poor interconnection.

Also, in the air cylinder type apparatus, since a feed portion is suddenly actuated, it is difficult to control a feed speed of the carrier tape itself. Thus, a stable feed speed can not be obtained.

Further, in an apparatus where the ratchet mechanism is used as a feed mechanism, the carrier tape does not move backward by the ratchet, i.e. a reversal preventive effect can be obtained. However, since the carrier tape is freely moved in its advancing direction, the carrier tape is unstable and the parts on the carrier tape may not be taken out properly by the attaching machine. Also, it is difficult to change the feed pitch.

Particularly, in the apparatus formed of the air cylinder and the ratchet mechanism, the apparatus itself is complicated, maintenance thereof becomes troublesome, and a cost of the apparatus is raised.

Thus, the present invention has been made to solve the above described problems, and an object of the invention is to provide an automatic parts feeding apparatus, wherein the carrier tape can be fed smoothly.

Another object of the invention is to provide an automatic parts feeding apparatus, wherein a stable and positive part supply can be obtained.

A further object of the invention is to provide an automatic parts feeding apparatus, wherein the carrier tape can be fed at a desired speed.

Further objects and advantages of the invention will be apparent from the following description of the invention.

SUMMARY OF THE INVENTION

In an automatic parts feeding apparatus, a plurality of parts is accommodated on a long carrier tape, and is transferred toward a processing machine by using a plurality of feed perforations provided on the carrier tape in accordance with pitches of the parts.

The automatic parts feeding apparatus of the invention is formed of a driving shaft rotated in one direction, a first cam member fixed to the driving shaft and having a first cam surface, a first moving member abutting against the first cam surface of the first cam member, and a first feed member attached to the first moving member. The first moving member is elevated, advanced, lowered and retreated sequentially in order by the rotation of the first cam member. The first feed member engages at least one feed perforation of the carrier tape when the first moving member is elevated, and it advances the carrier tape when the first moving member is advanced. The first feed member disengages from the feed perforation when the first moving member is lowered.

When the first feed member is lowered through the rotation of the first cam member, the carrier tape is not transferred. In this position, the first feed member is retreated. By repeating the movements, the carrier tape can be fed or moved with a predetermined pitch. The parts carried by the carrier tape can be taken by the processing machine.

The feeding apparatus may include a positioning mechanism actuated in accordance with the movements of the first moving member. The positioning mechanism engages one of the feed perforations of the carrier tape when the first feed member does not engage one of the feed perforations, and disengages from the feed perforations when the first feed member engages one of the feed perforations. Thus, the carrier tape is always fixed to a predetermined position, and when the part is taken out, a blind or unnecessary movement of the carrier tape is prevented.

The feeding apparatus may further include an additional driving shaft situated parallel to the driving shaft, a first additional cam member fixed to the additional driving shaft, and a link for linking the first cam member and the first additional cam member. The first additional cam member abuts against the first moving member together with the first cam member to thereby stably move the first moving member.

The feeding apparatus may further include a detecting device for detecting one feed movement of the carrier tape fed by the first feed member, and a control device connected to the detecting device. The control device stops actuation of the driving shaft for picking up the part from the carrier tape by the processing machine when the first moving member is once advanced.

Instead of using the positioning mechanism, the feeding apparatus may include a second cam member having a second cam surface similar to the first cam surface and fixed to the driving shaft such that the second cam surface is changed angularly at 180° relative to the first cam surface, a second moving member abutting against the second cam surface of the second cam member, and a second feed member attached to the second moving member. The second moving member is elevated, advanced, lowered and retreated sequentially in order by the rotation of the second cam member. The second feed member engages at least one feed perforation of the carrier tape when the second moving member is elevated, and it advances the carrier tape when the second moving member is advanced. Also, the second feed member disengages from the feed perforation when the second moving member is lowered.

When the first feed member engages at least one feed perforation to advance the carrier tape, the second feed member does not engage any feed perforation of the carrier tape. When the first feed member disengages from the feed perforation, the second feed member is raised to engage a different feed perforation. The carrier tape is then moved by the second feed member. When the part is removed from the carrier tape, the tape is held by one of the first and second feed members. By repeating the movements, the carrier tape is advanced at a predetermined pitch.

BRIEF DESCRIPTION OF THE DRAWINGS

FIGS. 5(a)–5(e) are diagrams for explaining operation states of the apparatus shown in FIG. 4.

DETAILED DESCRIPTION OF PREFERRED EMBODIMENTS

Figure 1:
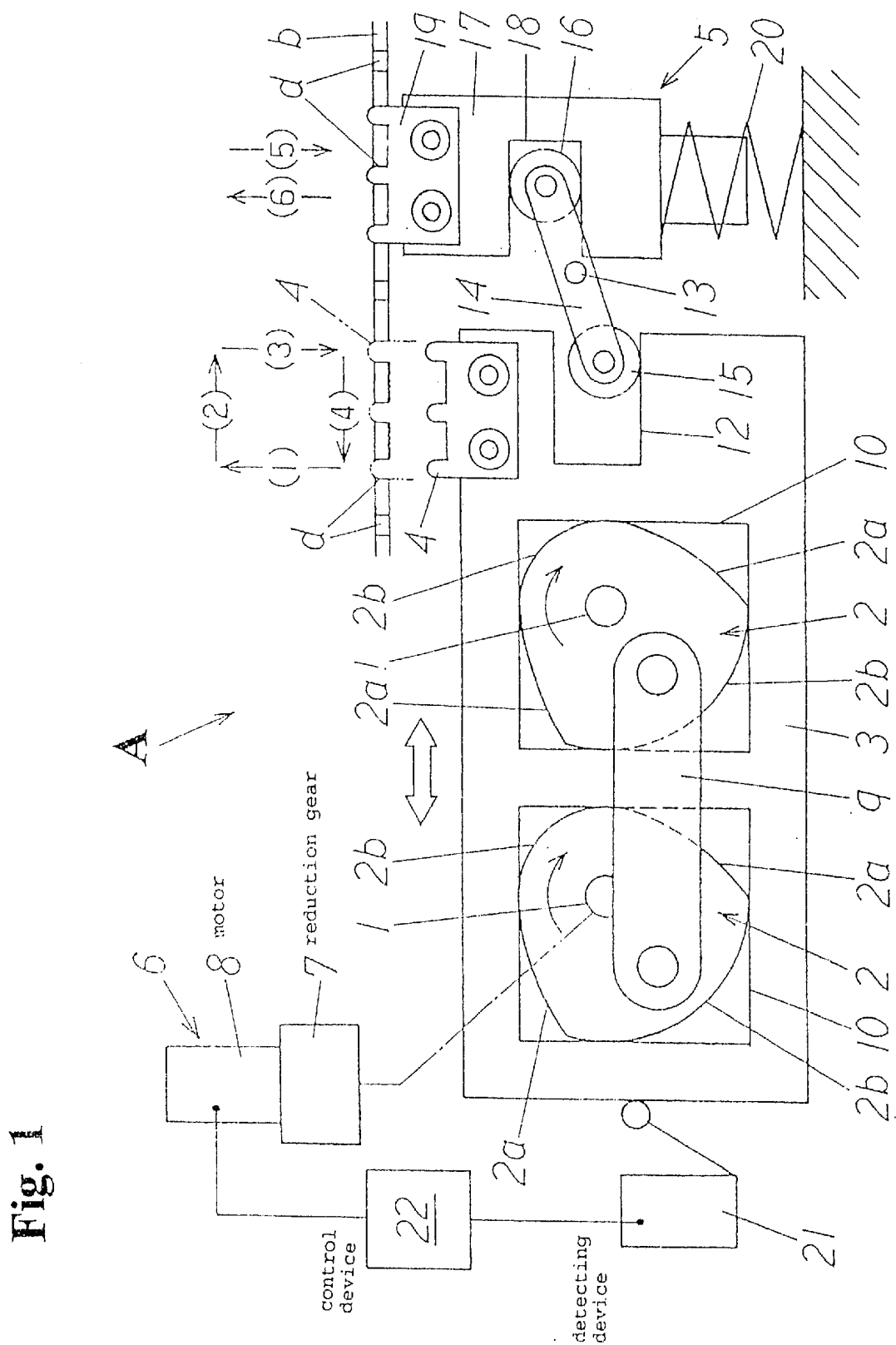
FIG. 1 is a front view for showing a first embodiment of an automatic parts feeding apparatus according to the present invention.

Examples of automatic parts feeding apparatuses according to the present invention are explained referring to the drawings.

Figure 2:
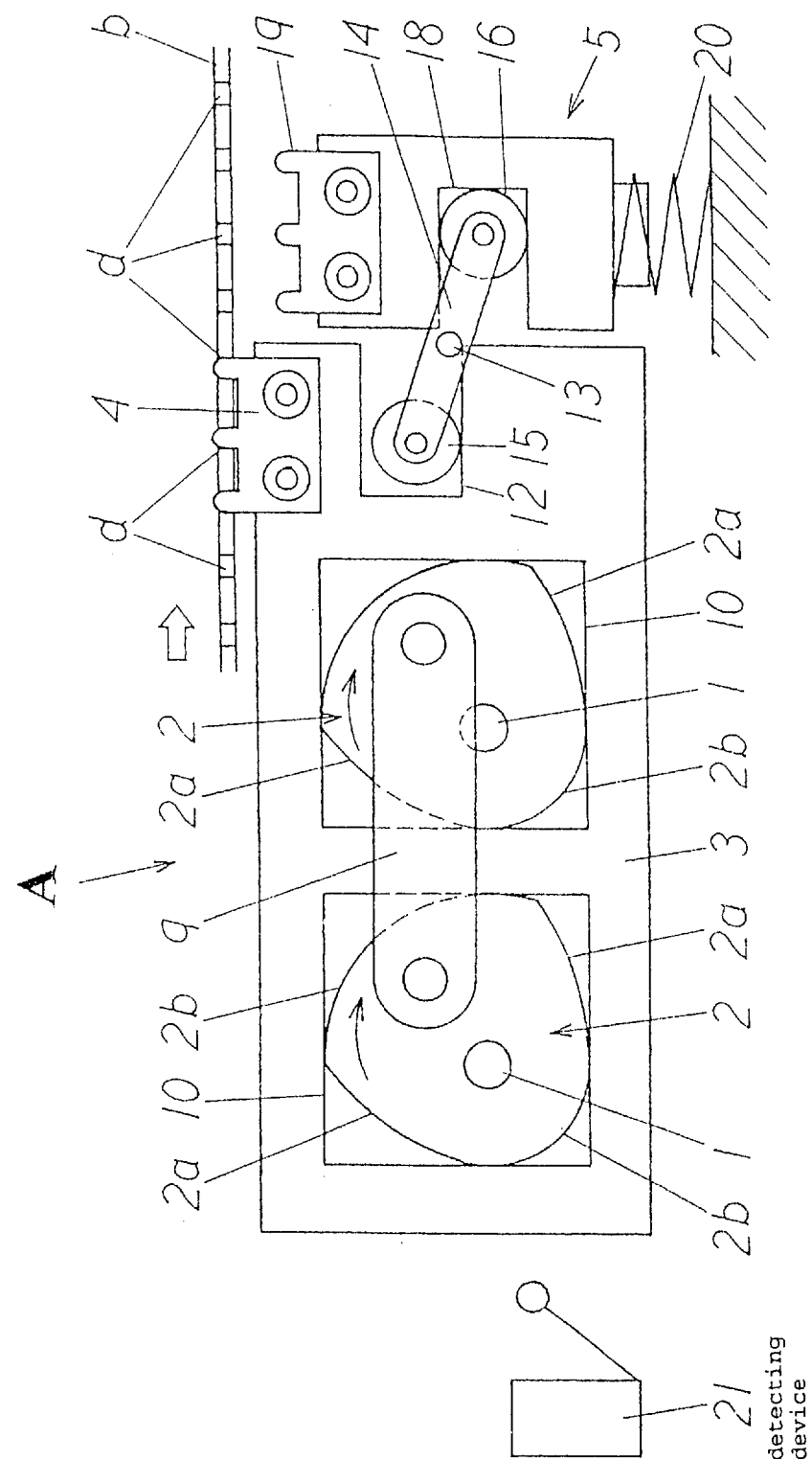
FIG. 2 is a front view for showing an operation state of the automatic parts feeding apparatus shown in FIG. 1.
Figure 3:
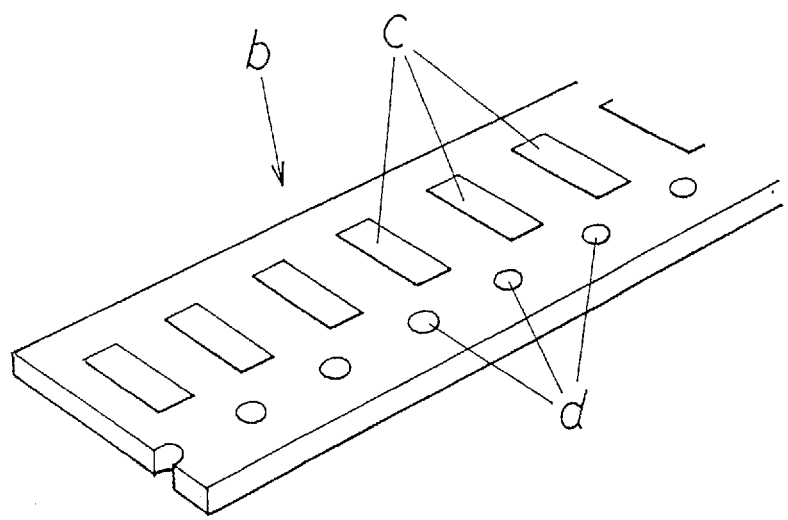
FIG. 3 is a perspective view for showing a part of a carrier tape to be used in the apparatus as shown in FIG. 1.
Figure 4:
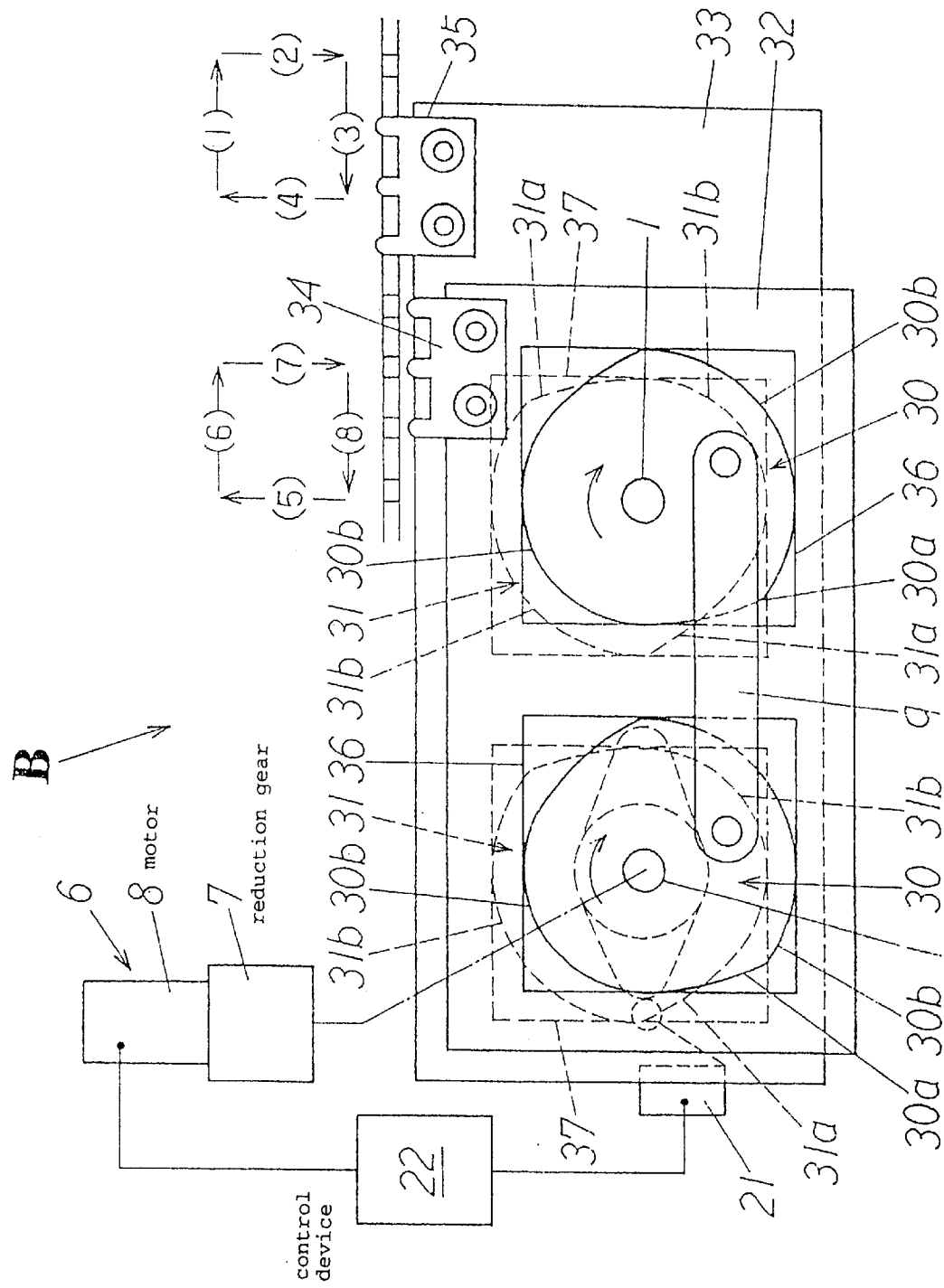
FIG. 4 is a front view for showing a second embodiment of an automatic parts feeding apparatus according to the present invention.

In FIGS. 1, 2 and 4, reference symbols A and B are automatic parts feeding apparatuses, respectively. As shown in FIG. 3, a plurality of electronic parts c is accommodated on a long carrier tape b with a predetermined pitch therebetween. The electronic parts c are transferred toward a processing machine (not shown) by a plurality of feed perforations d with pitches corresponding to pitches for the electronic parts c.

First, a first embodiment A is shown in FIGS. 1 and 2. The first embodiment A is basically formed of driving shafts 1, cam members 2, a moving member 3, a feed member 4, and a positioning device 5.

The driving shafts 1 are rotatable in one direction by a driving device 6 and supported by a machine frame (not shown). The driving shafts 1 may be a single shaft. However, a plurality of, at least two, shafts situated side by side with a predetermined space therebetween is preferable in order to allow the moving member 3 to make a smooth transferring movement.

The cam members 2 are fixed to and supported by the driving shafts 1, respectively, in eccentric conditions. A transferring or moving amount due to the eccentric condition becomes a lateral pitch corresponding to the feed perforations d, i.e. a pitch for receiving the electronic parts c, and a vertical movement is larger than the depth of the feed perforation d of the carrier tape b. Each cam member includes elevating and lowering portions 2a for performing elevating and lowering movements, and advancing and retreating portions 2b for performing advancing and retreating movements.

Incidentally, as the driving device 6, a commonly used motor 8 having a reduction gear 7 is used. The respective driving shafts 1 are interconnected by an interconnecting member 9, such as a link, supported by shafts at both ends and connected to the same phase portions of the cam members 2. As the interlocking member 9, though not shown, there may be employed any suitable means such that the driving shafts can be rotated synchronously by, such as a timing belt tightly situated around the respective driving shafts or interconnecting gears engaged through a counter gear.

The moving member 3 is provided with receiving portions 10 abutting against the elevating and lowering portions 2a, and the advancing and retreating portions 2b in the cam surfaces of the respective cam members 2, so that the moving member 3 can be sequentially elevated, advanced, lowered and retreated like a movement along a parallelogram for eccentric amounts of the cam members relative to the driving shafts by rotational movements of the cam members 2. In case one driving shaft 1 is provided, the moving member 3 may be engaged with a guide member (not shown) corresponding to its locus in order to obtain a stable movement.

The feed member 4 may be fixed to any suitable place, for example an upper forward end, of the moving member 3 in a transferring direction to be engageable with the feed perforations d of the carrier tape b. The feed member 4 may have one or a plurality of sharp heads to be easily engaged with the feed perforations d, which can be engaged with one or more of the feed perforations d at the same time.

Incidentally, when the feed member 4 is engaged with the feed perforations d of the carrier tape b, the positioning device 5 is not engaged with other feed perforations d, and when the feed member 4 is not engaged with the feed perforations d, the positioning device 5 is engaged with other feed perforations d of the carrier tape b. Thus, a blind or unnecessary movement of the carrier tape b can be prevented when the electronic part c is taken out by the processing machine.

This positioning device 5 may be located at any suitable place in a transferring direction of the carrier tape b, if it does not interfere with the feed member 4. More specifically, a receiving recess 12 is formed at a forward edge of the moving member 3 actuated by the cam members 2, and an arm 14 rotatably supported at an intermediate portion thereof by a supporting shaft 13 is provided at one end with a roller 15 received in the receiving recess 12 and at the other end with a roller 16 located in a receiving portion 18 of an elevating and lowering member 17.

Further, on an upper portion of the elevating and lowering member 17, a stop member 19 to be engaged with one or more of the feed perforations d of the carrier tape b is provided.

Incidentally, the elevating and lowering member 17 is provided with a spring 20 so that the stop member 19 is always urged toward a side where the stop member 19 is engaged with the feed perforations d.

The positioning device 5 is automatically operated by a device operated by an actuation of the moving member 3. However, the positioning device 5 may be operated by any means, such as the driving device 6 interconnected with the moving member 3, one of the members 1, 2 and 4 operated by the driving device 6, or a device operated by an actuation of a control device 22. For example, although it is not shown, the stop member 19 can be elevated and lowered by an air cylinder, motor or the like actuated by a signal of a detecting device 21 interconnected with the moving member 3, or the stop member 19 can be elevated and lowered by an air cylinder, motor or the like controlled by the control device 22 based on rotational pulse signals of the driving shafts 1 and the motor 8.

Also, in FIGS. 1 and 2, reference numeral 21 is the detecting device. The detecting device 21 is interconnected with at least a part of the driving shafts 1, the cam members 2, the moving member 3 or the feed member 4, or the driving device 6 itself to detect one feed movement of the carrier tape b by the feed member 4. The detected signal is transmitted to the control device 22, such as a computer, to actuate a clutch (not shown) built in the driving device 6 or driving shafts 1, and stops rotation of the driving shafts 1.

In case the detecting device 21 is interconnected with one of the members 2, 3 and 4, a known device, such as a limit switch, a photoelectric tube or a switch which is turned on when the member 1, 2, 3 or 4 comes close to the switch, can be used. In case a switch is used for the driving device 6 or the driving shafts 1, the switch may be a known device for detecting a rotation pulse or a rotary encoder.

Therefore, in the apparatus A of the first embodiment having a structure as described above according to the present invention, when the driving device 6 is continuously driven to rotate one of the driving shafts 1, one cam member 2 fixed to the driving shaft 1 being driven is rotated, and the other cam member 2 connected to the one cam member 2 by the interconnecting member 9 is also synchronously rotated.

With the rotation, the moving member 3 in which the cam surfaces of the cam members 2 abut against the receiving portions 10 is elevated, advanced, lowered and retreated.

At first, the elevating and lowering portions 2a of the cam members 2 elevate the receiving portions 10, i.e. the moving member 3, so that the feed member 4 is elevated toward an arrow (1) direction as shown in FIG. 1 from a waiting position at a lower position as shown in the same drawing to thereby engage the feed member 4 with the feed perforations d of the carrier tape b.

Further, with the rotation of the cam members 2, the advancing and retreating portions 2b advance the receiving portions 10, i.e. the moving member 3, toward an arrow (2) direction as shown in FIG. 1, so that the carrier tape b is advanced for a distance corresponding to one electronic part c according to an engaging condition of the feed perforations d, as shown in FIG. 2, and the electronic part c on the carrier tape b is taken out by the processing machine.

At this time, in the positioning device 5 interconnected with the moving member 3, the arm 14 is pivoted by the roller 15 engaged with the receiving recess 12 of the moving member 3 at one end and moved upwardly, and the elevating and lowering member 17 is lowered by the roller 16 provided at the other end of the arm 14. Thus, the stop member 19 of the elevating and lowering member 17 is lowered, in an arrow (5) direction as shown in FIG. 1, to a position as shown in FIG. 2. Thus, the movement of the carrier tape is not prevented.

More specifically, when the feed member 4 is engaged with the feed perforations d of the carrier tape b, the stop member 19 is not engaged with other feed perforations d. Also, when the feed member 4 is not engaged with the feed perforations d of the carrier tape b, the stop member 19 is engaged with other feed perforations d. Therefore, the carrier tape b is always located in a predetermined position, so that when the electronic part c is taken out, the carrier tape b is fixed not to cause a blind or unnecessary movement.

Then, with the further rotation of the cam members 2, the moving member 3 is lowered while the receiving portions 10 abut against the elevating and lowering portions 2a, so that the feed member 4 is lowered in an arrow (3) direction, as shown in FIG. 1, to release the engagement between the feed member 4 and the feed perforations d.

Next, with the rotation of the cam members 2, the advancing and retreating portions 2b retreat the receiving portions 10, i.e. the moving member 3, in an arrow (4) direction, as shown in FIG. 1, to return the member 3 to the waiting position, while the retreated moving member 3 contacts the detecting device 21 to generate a signal. The generated signal is transmitted to the control device 22 to stop rotation of the motor 8 in the driving device 6, so that the transfer movement of the moving member 3 is stopped.

Incidentally, the next start of the driving device 6 is initiated by a signal from the processing machine or a delay device through the control device 22.

In the positioning device 5 interconnected with the moving member 3, according to a lowering movement of the moving member 3 through the rotations of the cam members 2, one end of the arm 14 is moved downwardly through the roller 15 engaged with the receiving recess 12 of the moving member 3, and the elevating and lowering member 17 is elevated through the roller 16 fixed to the other end of the arm 14. Therefore, the stop member 19 of the elevating and lowering member 17 is elevated, in an arrow (6) direction in FIG. 1, to a position shown in the same drawing. Thus, the movement of the carrier tape b is controlled, and the carrier tape b is not moved. When the movements as described above are repeated, the carrier tape can be fed at a predetermined pitch.

Next, a second embodiment B of an automatic parts feeding apparatus according to the present invention is explained with reference to FIGS. 4 and 5(a)–5(e).

In the example, a transfer and stop control, i.e. positioning, of the carrier tape b is carried out by a pair of feed members. The automatic parts feeding apparatus comprises driving shafts 1, first and second cam members 30, 31, first and second moving members 32, 33, and first and second feed members 34, 35. A structure of the automatic parts feeding apparatus B is basically the same as that of the first embodiment A.

The driving shafts 1 are provided to be rotatable in one direction by the driving device 6 and supported by the machine frame (not shown). The driving shafts 1 may be single, but it is preferable that a plurality of, at least two rows, shafts is disposed side by side with a predetermined space therebetween to obtain smooth movements of the first and second moving members 32, 33 described later.

One first cam member 30 and one second cam member 31 are fixed to one driving shaft 1 in parallel, and are supported by the shaft in an eccentric state, respectively, wherein a transferring amount in the vertical direction is larger than the depth of the feed perforation d of the carrier tape b, and the transferring amount in the lateral direction corresponds to a pitch of the feed perforations d, i.e. electronic parts c. The both cam members 30, 31 have cam surfaces including elevating and lowering portions 30a, 31a for performing elevating and lowering movements, and advancing and retreating portions 30b, 31b for performing advancing and retreating movements. One first cam member 30 and one second cam member 31 are supported by one shaft 1 with a displacement of 180° as a rotational transfer angle, respectively.

Incidentally, as the driving device 6, a commonly used motor 8 having a reduction gear 7 is used. The driving shafts 1 are interlocked together through an interlocking member 9, such as a link, supported by shafts at both ends at the same phase portions of the first and second cam members 30, 31, and are rotated together. As the interlocking member 9, though not shown, there may be employed any suitable means such that the driving shafts can be rotated synchronously by, such as a timing belt tightly situated around the respective driving shafts or interconnecting gears engaged through a counter gear.

The respective moving members 32, 33 are provided with receiving portions 36, 37 abutting against the elevating and lowering portions 30a, 31a and the advancing and retreating portions 30b, 31b of the first and second cam members 30, 31, so that the moving members 32, 33 are elevated, advanced, lowered and retreated like movements along a parallelogram by the rotational movements of the cam members 30, 31. In case the driving shaft 1 is single, the moving members 32, 33 may be engaged with guide members (not shown) to provide the stable movements.

The first and second feed members 34, 35 may be fixed to any suitable places, for example upper forward ends, of the moving members 32, 33 in a transferring direction to be engageable with the feed perforations d of the carrier tape b. Each of the feed members 34, 35 has one or more feed pawls with a sharp head to be easily engaged with the feed perforations d of the carrier tape b, and engages one or more feed perforations d at the same time.

Incidentally, in FIG. 4, reference numeral 21 is a detecting device, and the same detecting device as in the first embodiment A can be employed. The detecting device 21 is interconnected with at least one of the driving shafts 1, the first and second cam members 30, 31, the first and second moving members 32, 33, and the first and second feed members 34, 35, and the driving device 6 itself to detect one feed movement of the carrier tape b fed by the first and second feed members 34, 35. The detected signal is transmitted to the control device 22, such as a computer, to actuate clutches (not shown) built in the driving device 6 or driving shafts 1, and stop rotations of the driving shafts 1.

Therefore, in the apparatus B of the second embodiment having a structure as described above according to the present invention, when the driving device 6 is continuously driven to rotate the driving shafts 1, one pair of the first and second cam members 30, 31 fixed to one driving shaft 1 is rotated, and the other pair of the first and second cam members 30, 31 connected to the one pair of the first and second cam members 30, 31 through the interlocking member 9 is also synchronously rotated.

With the rotations, the first and second moving members 32, 33 abutting against the cam surfaces of the first and second cam members 30, 31 in the receiving portions 36, 37 are elevated, advanced, lowered and retreated.

Incidentally, in FIGS. 4 and 5(a)–5(e), (1)–(4) show movements of the second moving member 33 and the second feed member 35, and (5)–(8) show movements of the first moving member 32 and the first feed member 34.

In these movements, (8) and (1); (5) and (2); (6) and (3); and (7) and (4) correspond to each other.

Now, the elevating, advancing, lowering and retreating movements are explained in detail. In FIG. 4, the advancing and retreating portions 31b of the second cam members 31 advance the receiving portions 37, i.e. the second moving member 33, to thereby advance the second feed member 35 to an arrow (1) direction as shown in FIG. 4 in a state engaging with the feed perforations d as shown in the same drawing or in FIG. 5(a), so that the carrier tape b is moved toward a processing machine, as shown in FIG. 5(b), and an electronic part c on the carrier tape b is taken out at the processing machine.

During the period, the first feed member 34 is also actuated. More specifically, the respective elevating and lowering portions 30a of the first cam members 30 elevate the receiving portions 36, i.e. the first moving member 32, so that the first feed member 34 is elevated from a lower waiting position as shown in FIG. 4 or a position shown in FIG. 5(b) toward an arrow (5) direction in FIG. 4 to thereby allow the first feed member 34 to engage the feed perforations d as shown in FIG. 5(c) and to position the carrier tape b. Thus, when an electronic part c is taken out by the processing machine, a blind or unnecessary movement of the carrier tape b can be prevented, by which the next advancing preparation of the carrier tape b is completed.

Through the further rotations of the second cam members 31, the elevating and lowering portions 31a thereof lower the receiving portions 37, i.e. the second moving member 33, in an arrow (2) direction in FIG. 4, so that the second feed member 35 is disengaged from the feed perforations d as shown in FIG. 5(c).

The processes up to this point constitute one movement of the carrier tape b, and the rotating shafts 1 are driven by 180°.

Further, in the next 180° driving of the rotating shafts 1 through the rotations of the second cam members 31, the advancing and retreating portions 31b thereof retreat the receiving portions 37, i.e. the second moving member 33, in an arrow (3) direction in FIG. 4 or to a position shown in FIG. 5(d), so that the second feed member 35 waits under the next feed perforations d. Also, under a condition where the first feed member 34 is engaged with the feed perforations d, the advancing and retreating portions 30b advance the receiving portions 36, i.e. the first moving member 32, in an arrow (6) direction in FIG. 4 through the rotations of the first cam members 30, so that while engaging with the feed perforations d, the first feed member 34 advances the carrier tape b, as shown in FIG. 5(d), to thereby transfer the carrier tape b toward the processing machine. Then, the next electronic part c on the carrier tape b is taken out by the processing machine.

At this time, the second feed member 35 is also actuated. More specifically, the respective elevating and lowering portions 31a of the second cam members 31 elevate the receiving portions 37, i.e. the second moving member 33, so that the second feed member 35 is elevated from a retreated position towards an arrow (4) direction as shown in FIG. 4 to allow the second feed member 35 to engage the feed perforations d of the carrier tape b and to position the carrier tape b. Thus, when the electronic part c is taken out by the processing machine, a blind or unnecessary movement of the carrier tape b can be prevented, by which the next advancing preparation of the carrier tape b is completed.

Through the further rotations of the first cam members 30, the respective elevating and lowering portions 30a thereof lower the receiving portions 36, i.e. the first moving member 32, in an arrow (7) direction in FIG. 4, so that the first feed member 34 is disengaged from the feed perforations d as shown in FIG. 5(e). Then, through the rotations of the first cam members 30, the advancing and retreating portions 30b thereof retreat the receiving portions 36, i.e. the first moving member 32, in an arrow (8) direction in FIG. 4, so that the first feed member 34 waits under the next feed perforations d as shown in FIG. 5(a).

By repeating the processes as described above in order, the carrier tape b can be automatically fed with a predetermined pitch.

Incidentally, the rotations of 180° of the driving shafts 1 are detected by the detecting device 21, by which the rotation of the motor 8 in the driving device 6 is stopped. Then, the electronic part c is taken out by the processing machine. Therefore, the rotation of the driving device 6 does not bother the removal of the electronic part c by the processing machine.

By the way, restarting of the driving device 6 is carried out through the control device 22 based on signals from the processing machine, the delay device and the like.

As described above, according to the present invention, since the feed member for feeding the carrier tape is driven by a driving device, such as a motor, operation speeds of the respective members actuated by the driving device are constant and stable, and blind or unnecessary movements of the electronic parts accommodated on the tape during the transfer thereof can be prevented. Also, since acceleration and deceleration in moving the carrier tape can be controlled based on the cam characteristics, the carrier tape can be smoothly fed.

Also, the driving device comprising a motor is superior in response with respect to starting and stopping, and a feed speed of the carrier tape can be easily controlled.

When one feed member is engaged with the feed perforations of the carrier tape, other feed perforations are not engaged with the other feed member, while when the one feed member is not engaged with the feed perforations of the carrier tape, other feed perforations are engaged with the other feed member. Thus, the movement of the carrier tape is always controlled by the feed members, so that the stable positioning can be obtained and the blind movement of the tape can be prevented when the electronic part is taken out.

Further, the automatic parts feeding apparatus of the invention is provided with the detecting device for detecting one feed movement of the carrier tape fed by the feed member, which is associated with the driving device or at least one member actuated by the driving device or a control device connected to the detecting device. Therefore, a feed pitch change can be easily carried out.

What is claimed is:

1. An automatic parts feeding apparatus for transferring a carrier tape having parts thereon and feed perforations in a predetermined pitch, comprising:

a first driving shaft rotated in one direction, a first cam member fixed to the first driving shaft and having a first cam surface, a moving member having a frame, a first receiving portion formed inside the frame in which said first cam member is located to contact therewith, a receiving recess formed at one side of the frame, and means for keeping orientation of the frame so that when the first driving shaft is actuated, the moving member is elevated, advanced, lowered and retreated sequentially in order through the rotation of the first cam member without changing the orientation of the frame, a feed member attached to the moving member, said feed member being elevated, advanced, lowered and retreated together with movements of the moving member, said feed member being adapted to engage a fed perforation of a carrier tape when the feed member is elevated and advanced, and a positioning mechanism situated adjacent to the moving member, said positioning mechanism including an elevating and lowering member having a receiving portion at one side thereof, a stop member fixed to an upper portion of the elevating and lowering member, a supporting shaft immovably fixed relative to the moving member and the elevating and lowering member, and an arm pivotally connected to the supporting shaft and having first and second ends, said first end being slidably situated in the receiving recess of the moving member and the second end being slidably situated in the receiving portion of the elevating and lower member so that when the feed member is lowered and retreated, the stop member is located at an upper position adapted to engage a feed perforation of the carrier tape, and when the feed member is elevated and advanced, the stop member is moved to a lower position.

2. An automatic parts feeding apparatus according to claim 1, wherein said positioning mechanism further includes a spring attached to the elevating and lowering member to urge the elevating and lowering member upwardly.

3. An automatic parts feeding apparatus according to claim 1, further comprising a second driving shaft situated parallel to the first driving shaft, a second cam member having a shape same as the first cam member and being fixed to the second driving shaft, and a link for linking the first and second cam members, said frame having a second receiving portion therein to rotationally receive said second cam member, said second driving shaft, second cam member, link and second receiving portion providing a smooth movement of the moving member and forming said means for keeping orientation of the frame.

4. An automatic parts feeding apparatus according to claim 1, further comprising a driving device connected to the first driving shaft for rotating the same, a detecting device attached to the moving member for detecting one feed movement of the moving member, and a control device connected to the driving device for controlling an intermittent movement of the moving member.

* * * * *